United States Patent
Sebald et al.

(10) Patent No.: US 6,885,256 B2
(45) Date of Patent: Apr. 26, 2005

(54) INPUT CIRCUIT FOR AN HF-TRANSMITTING COMPONENT

(75) Inventors: Marc Sebald, Aifeld (DE); Jürgen Zimmermann, Nürnberg (DE); Wolfgang Werner, Cadolzburg (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 32 days.

(21) Appl. No.: 10/440,615

(22) Filed: May 19, 2003

(65) Prior Publication Data

US 2003/0218489 A1 Nov. 27, 2003

(30) Foreign Application Priority Data

May 25, 2002 (DE) .......................................... 102 23 396

(51) Int. Cl.⁷ .................................................. H03C 3/38
(52) U.S. Cl. ...................................... 332/120; 455/119
(58) Field of Search ................................ 332/120, 127, 332/170; 455/119, 127.3, 109, 113

(56) References Cited

U.S. PATENT DOCUMENTS

| | | | |
|---|---|---|---|
| 3,644,831 A | * | 2/1972 | Latker et al. ............... 455/109 |
| 4,755,774 A | | 7/1988 | Heck ........................... 332/123 |
| 5,079,526 A | | 1/1992 | Heck ........................... 332/127 |
| 5,646,701 A | * | 7/1997 | Duckworth et al. ... 340/825.69 |
| 5,758,265 A | * | 5/1998 | Okanobu ...................... 455/76 |
| 5,940,457 A | | 8/1999 | Dreifuss et al. ............ 375/376 |
| 2004/0108916 A1 | * | 6/2004 | Kwong et al. .............. 333/174 |

OTHER PUBLICATIONS

Infineon Technologies, "Wireless Components", ASK/FSK Transmitter 868/433 MHz; TDA 5100 Version 2.1, Specification Jun. 2001.

* cited by examiner

Primary Examiner—Robert Pascal
Assistant Examiner—Joseph Chang
(74) Attorney, Agent, or Firm—Scully, Scott, Murphy & Presser

(57) ABSTRACT

An input circuit for an HF-transmitting component 1 of a battery-operated device for the transmission of a data signal aims to reduce the power consumption. For that purpose the fundamental frequency of a reference oscillator 5 is modulated with the digital data signal, the data rate being greater than 20 kchip/s. For smoothing of the modulated reference signal an amplitude limiter 11 and a band pass filter 15 are connected between the reference oscillator 5 and the HF-transmitting component 1.

13 Claims, 2 Drawing Sheets

INPUT CIRCUIT FOR AN HF-TRANSMITTING COMPONENT

BACKGROUND OF THE INVENTION

1. Field of the Invention

Figure 1:
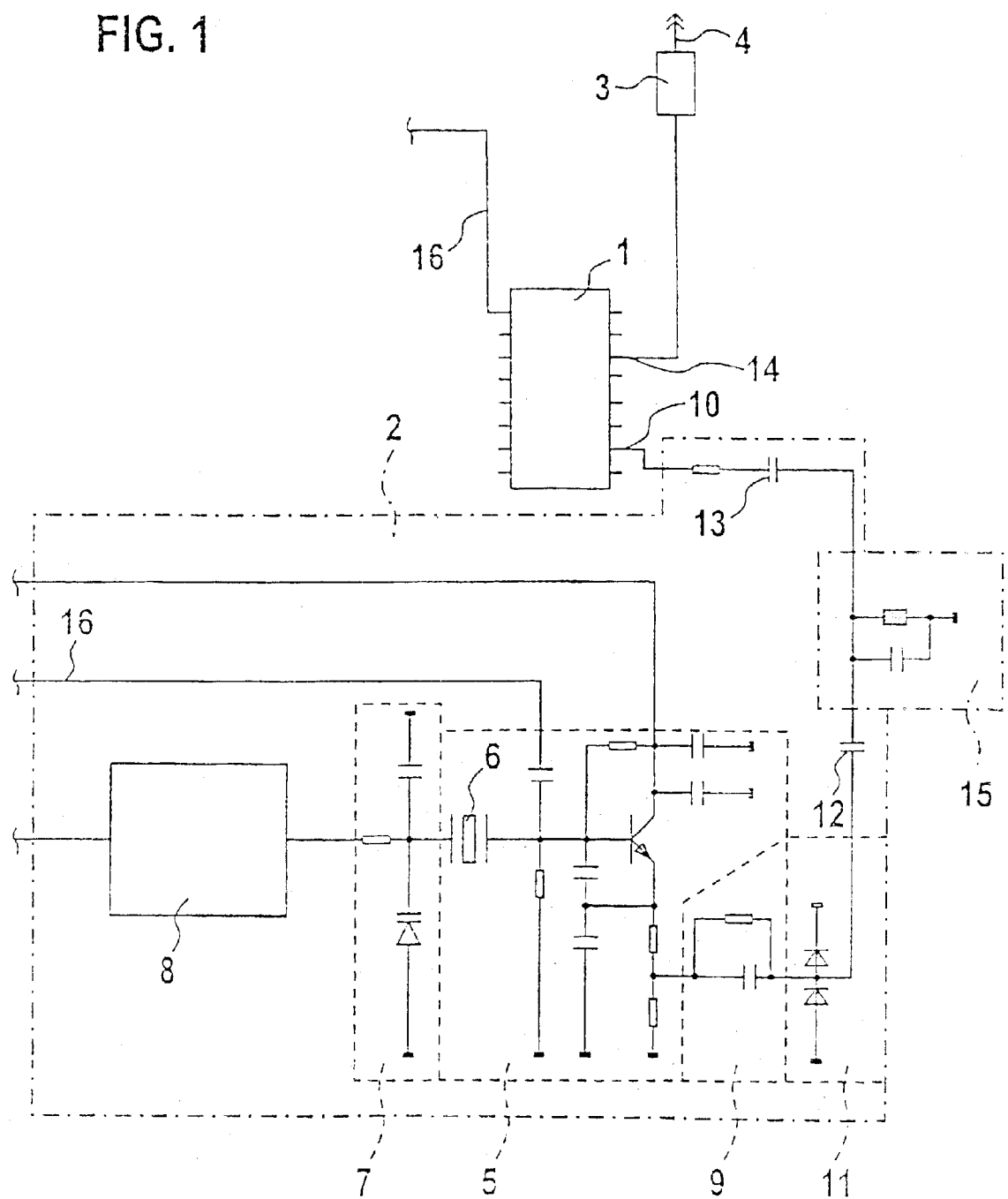

The invention concerns an input circuit for an integrated HF-transmitting component of a battery-operated device for the transmission of a data signal, wherein a reference oscillator is connected to one of the inputs of the transmitting component.

2. Discussion of the Prior Art

Battery-operated devices of that kind are, for example, consumption measuring devices which cyclically transmit radio signals corresponding to the respective consumption status in order to be able to detect the consumption status for consumption billing from outside the building or room in which the consumption is taking place. Such consumption measuring devices can serve for a determination of the water consumption measured by means of a water meter, or for the heat consumption of heating devices or power consumption. The consumption measuring devices should consist of a small compact structure, and are to be maintenance-free over a period of several years. For example, radio frequencies of 433 MHz, 868 MHz and 915 MHz (USA) are provided for the operation of such devices.

The ASK/FSK-transmitter 868/433 MHz TDA5100 or TDA5102 (USA-version) or the TDA51xx family from Infineon Technologys AG are known as an inexpensive HF-transmitting component. Similar components are also known as being available from other manufacturers. With the usual connection of the transmitting component to a reference oscillator the data rate which can be transmitted is limited to about 20 kchip/s; which represents a drawback. This is because, the lower the data rate is, the correspondingly longer the data telegrams become, and correspondingly greater because the current consumption during the transmission of the data telegrams. A high level of power consumption is inexpedient because the battery-operated device is intended to operate for years without the batteries having to be replaced or re-charged.

SUMMARY OF THE INVENTION

Accordingly, an object of the invention is to provide an input circuit of the kind set forth in the introductory portion of this specification, with which the transmitted data rate can be selected to be very high.

According to the invention the foregoing object is attained in that the fundamental frequency of a reference oscillator, the latter of which si connected to one of the inputs of an HF-transmitting component, is modulated with a digital data signal, wherein the data rate is greater than 20 k chips/s, and in which an amplitude limiter and a band-pass filter are connected between the reference oscillator and the HF-transmitting component.

The high data rate provides that the data telegrams which contain for example an identification and a counter state each are of very short duration. The transmission thereof therefore consumes correspondingly little power from the battery. In order to ensure that the known HF-transmitting component operates reliably in spite of the high data rate, the amplitude of the modulated data signal is limited. This means that voltage peaks and voltage fluctuations of the frequency-modulated data signal are suppressed. The band-pass filter keeps troublesome harmonics and beats of the modulated data signal away from the HF-transmitting component.

In a further configuration, the data signal is applied to the reference oscillator by way of a prefilter which reduces the edge gradient of the data signal. Due to the reduced edge steepness, harmonics of the digital data signal are already suppressed prior to the reference oscillator.

BRIEF DESCRIPTION OF THE ACCOMPANYING DRAWINGS

Figure 2A:
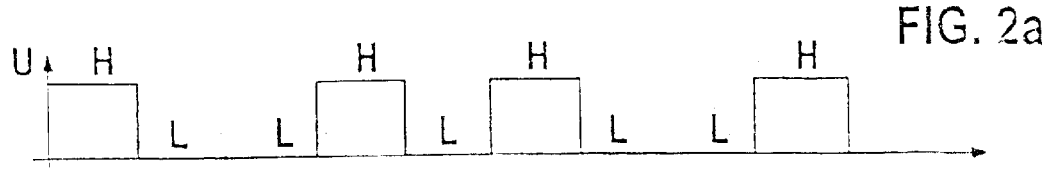
Figure 2B:
Figure 2C:
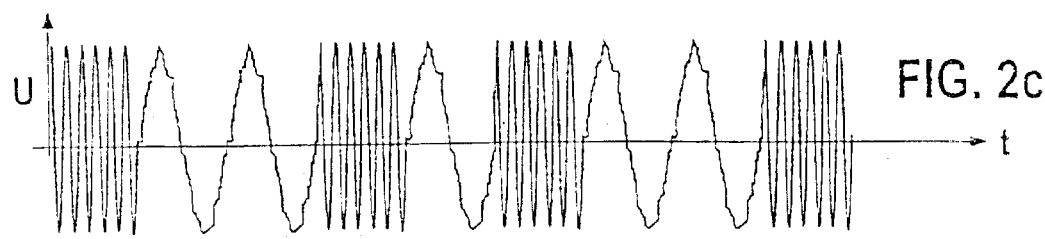
Figure 2D:
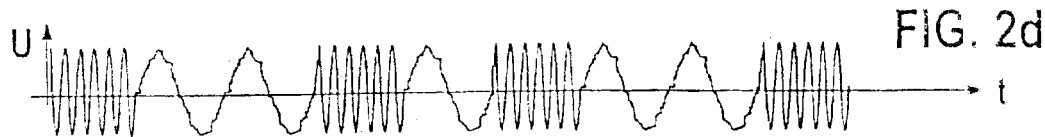
Figure 2E:
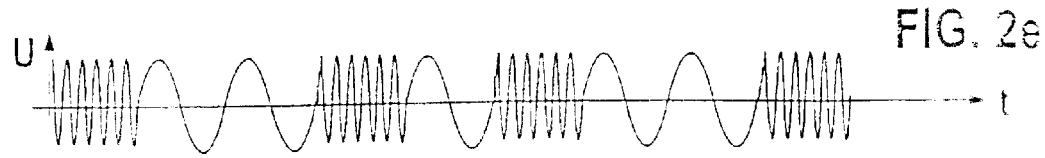

Further advantageous configurations of the invention are set forth in the description hereinafter through an exemplary embodiment as illustrated in the drawings; in which:

FIG. 1 shows a block circuit diagram of an HF-transmitting component with input circuit, FIG. 2 shows voltage graphs, wherein FIG. 2*a* shows a part of a digital data signal, FIG. 2*b* shows the same when prefiltered, FIG. 2*c* shows a frequency-modulated reference signal, FIG. 2*d* shows the same when amplitude-limited, and FIG. 2*e* shows the same when band width-limited.

DETAILED DESCRIPTION OF PREFERRED EMBODIMENTS

The HF-transmitting component 1 is the above-mentioned TDA5100, to the input 10 of which is connected an input circuit 2 and to the output 14 of which is connected an output circuit 3 with antenna amplifier and transmitting antenna 4.

The input circuit 2 has a reference oscillator 5 which is in the form of a Colpitts oscillator. It operates at a fundamental frequency of 6.788 MHz. Connected to its oscillator quartz 6 is a modulation device 7 which operates with a capacitance diode. Applied thereto by way of a prefilter 8 is the digital data signal (see FIG. 2*a*) which, for example, comes from a microcontroller which produces the signal from a measurement value.

An amplitude limiter 11 with two diodes is connected to the output of the reference oscillator 5 by way of a coupling member 9. A band-pass filter 15 is connected between the amplitude limiter 11 and the input 10 by way of further coupling members 12, 13.

The data signal is binary signal with a 3 from 6 coding, with a data rate of 100 kchip/s. FIG. 2*a* shows only a part of that data signal.

The prefilter 8 reduces the edge gradient of the data signal (as shown in FIG. 2*b*). The fundamental frequency, for example 6.788 MHz, of the reference oscillator 5 is modulated with the filtered data signal in such a way that, at the voltage level H of the data signal, the frequency is higher than at the voltage level L of the data signal (as shown in FIG. 2*c*). That modulated signal still has voltage peaks and harmonics superimposed thereon. In order to suppress the voltage peaks, the amplitude limiter 11 reduces the amplitude of the frequency-modulated reference signal, for example, to +/−300 to 600 mV (see FIG. 2*d*).

The band pass filter 15 which has a coil and a capacitor, limits the band width of the modulated reference signal in order to suppress harmonics and beat phenomena prior to the input 10 of the HF-transmitting component 1. The band pass filter 15 limits the band width around the fundamental frequency of about 6.788 MHz to about 500 kHz (see FIG. 2*e*). This means that the modulated reference signal is smoothed in such a way that it can be trouble-freely processed by the HF-transmitting component 1 notwithstanding the high data rate.

The HF-transmitting component 1 operates at a carrier frequency of 868.95 MHz. That carrier frequency is higher by a factor of 128 than the fundamental frequency of the reference oscillator 5. Provided in the HF-transmitting component 1 is a PLL-divider (phase-locked loop divider) with a divider factor of 128. In the HF-transmitting component 1 the internal frequency of 868.95 MHz is reduced by way of the divider to the fundamental frequency of 6.788 MHz of the reference oscillator 5, and then compared with the frequency-modulated reference signal at the input 10. The transmission frequency of 868.95 MHz is regulated in accordance with the comparison so that a transmission signal modulated in accordance with the original data signal (see FIG. 2a) occurs at the output 14 and thus at the transmitting antenna 4.

In order to save power, the HF-transmitting component 1 and the reference oscillator 5 are not constantly switched on, but are only cyclically switched on by the above-mentioned microcontroller. By way of example, switching-on is effected by way of switching-on lines 16 every 4 s for 4 ms. Transmission of the data signal takes place only within those short time windows. It has been found that those short transmission times are sufficient to emit counter states in such a way that they can be received in a vehicle which carries a corresponding receiver. It is thus easily possible to read off a counter state or count condition from outside of the buildings or rooms in which consumption is taking place.

What is claimed is:

1. An input circuit for an integrated HF-transmitting component of a battery-operated device for the transmission of a digital data signal, in which a reference oscillator is connected to one input of the HF-transmitting component, wherein a fundamental operating frequency of the reference oscillator is modulated with the digital data signal to increase or decrease the fundamental operating frequency of the references oscillator in accordance with the digital data signal, wherein a data rate is greater than 20 kchip/s, and wherein an amplitude limiter and a band pass filter are connected between the reference oscillator and the HF-transmitting component.

2. An input circuit according to claim 1, wherein the amplitude limiter limits the amplitude of the frequency-modulated signal of the reference oscillator to about +/−600 mV.

3. An input circuit according to claim 1, wherein the band-pass filter limits the band width of the frequency-modulated signal of the reference oscillator to about 500 kHz.

4. An input circuit according to claim 1, wherein a prefilter causes the digital data signal which is applied to the reference oscillator to reduce the edge gradient of the data signal.

5. An input circuit according to claim 1, wherein the digital data signal is applied to the reference oscillator through a modulation device having a capacitance diode.

6. An input circuit according claim 1, wherein the reference oscillator is a Colpitts oscillator.

7. An input circuit according to claim 1, wherein the fundamental operating frequency of the reference oscillator is lower than the transmission frequency of the HF-transmitting component.

8. An input circuit according to claim 7, wherein the fundamental operating frequency of the reference oscillator is about 6.788 MHz.

9. An input circuit according to claim 7, wherein the transmission frequency of the HF-transmitting component is about 868.5 MHz.

10. An input circuit according to claim 1, wherein the data rate is in a range from about 50 to 120 kchip/s.

11. An input circuit according to claim 10, wherein the data rate is about 100 kchip/s.

12. An input circuit according to claim 1, wherein the HF-transmitting component and the reference oscillator are switched on and off cyclically.

13. An input circuit according to claim 12, wherein the HF-transmitting component and the reference oscillator are switched on approximately every 4 s for 4 ms.

* * * * *